US009491393B2

United States Patent
Pereira et al.

(10) Patent No.: US 9,491,393 B2
(45) Date of Patent: *Nov. 8, 2016

(54) MULTI-CHIP MODULE FOR A MULTI-MODE RECEIVER AND METHOD THEREFOR

(71) Applicant: SILICON LABORATORIES INC., Austin, TX (US)

(72) Inventors: Vitor Pereira, Austin, TX (US); Pascal Blouin, Domloup (FR); David LeGoff, Tinteniac (FR); Frederic Nicolas, Chateaugiron (FR)

(73) Assignee: SILICON LABORATORIES, INC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/972,958

(22) Filed: Dec. 17, 2015

(65) Prior Publication Data

US 2016/0105629 A1 Apr. 14, 2016

Related U.S. Application Data

(62) Division of application No. 14/195,575, filed on Mar. 3, 2014, now Pat. No. 9,258,596.

(51) Int. Cl.
*H04N 5/46* (2006.01)
*H04N 21/426* (2011.01)
(Continued)

(52) U.S. Cl.
CPC ............... *H04N 5/46* (2013.01); *H04N 5/268* (2013.01); *H04N 5/455* (2013.01); *H04N 21/4263* (2013.01); *H04N 21/42615* (2013.01);
(Continued)

(58) Field of Classification Search
CPC combination set(s) only.
See application file for complete search history.

(56) References Cited

U.S. PATENT DOCUMENTS 8,526,898 B2  9/2013 Reddy et al.
8,571,111 B2  10/2013 Levy et al.
(Continued)

FOREIGN PATENT DOCUMENTS

GB  2518476 A  3/2015
KR  10-2012-0054431  5/2012

OTHER PUBLICATIONS

Silicon Laboratories Inc., Si2167-B20, "Combo DVB-T/C/S/S2 Digital TV Demodulator," 2 pages, Sep. 17, 2012, Silicon Laboratories Inc., 400 W. Cesar Chavez, Austin, Texas 78701.
(Continued)

*Primary Examiner* — Mulugeta Mengesha
(74) *Attorney, Agent, or Firm* — Polansky & Associates, P.L.L.C.; Paul J. Polansky (57) ABSTRACT

In one form, a multi-chip module for a multi-mode receiver includes an MCM substrate and first and second demodulator die. The MCM substrate has first and second satellite input ports, first and second terrestrial/cable input ports, and first and second transport stream ports. The first demodulator die has a satellite port coupled to the first satellite input port of the MCM substrate, a terrestrial/cable port coupled to the first terrestrial/cable input port of the MCM substrate, and first and second transport stream ports coupled to the first and second transport stream ports of the MCM substrate. The second demodulator die has a satellite port coupled to the second satellite input port of the MCM substrate, a terrestrial/cable port coupled to the second terrestrial/cable input port of the MCM substrate, and first and second transport stream ports coupled to the first and second transport stream ports of the MCM substrate.

20 Claims, 7 Drawing Sheets

(51) Int. Cl.
*H04N 21/438* (2011.01)
*H04N 21/462* (2011.01)
*H04N 21/61* (2011.01)
*H04N 5/455* (2006.01)
*H04N 5/268* (2006.01)

(52) U.S. Cl.
CPC .... *H04N21/42676* (2013.01); *H04N 21/4382* (2013.01); *H04N 21/4383* (2013.01); *H04N 21/4622* (2013.01); *H04N 21/6112* (2013.01); *H04N 21/6118* (2013.01); *H04N 21/6143* (2013.01); *H01L 2224/05554* (2013.01); *H01L 2224/48091* (2013.01); *H01L 2224/49113* (2013.01); *H01L 2225/06562* (2013.01)

(56) References Cited

U.S. PATENT DOCUMENTS

| | | |
|---|---|---|
| 2005/0276239 A1 | 12/2005 | Smallcomb et al. |
| 2007/0047870 A1* | 3/2007 | Jeong ................ H01L 25/18 |
| | | 385/14 |
| 2011/0133826 A1 | 6/2011 | Jones et al. |
| 2011/0242428 A1* | 10/2011 | Blouin ................ H04L 1/0047 |
| | | 348/726 |

OTHER PUBLICATIONS

International Search Report issued Aug. 25, 2015 from Related GB Application No. GB1503253.5.

* cited by examiner

MULTI-CHIP MODULE FOR A MULTI-MODE RECEIVER AND METHOD THEREFOR

This application is a division of prior application Ser. No. 14/195,575, filed Mar. 3, 2014, entitled "Demodulator and Multi-Chip Module for a Multi-Mode Receiver and Method Therefore".

FIELD OF THE DISCLOSURE

The present disclosure relates generally to receivers, and more particularly to multi-mode receivers such as television receivers capable of receiving and demodulating different input signal streams.

BACKGROUND

Certain television receivers support multiple simultaneous channel reception and demodulation of signals from different types of signal sources. For example, a television may support both satellite and terrestrial/cable input signal sources, and the user may desire to watch a satellite channel while recording a terrestrial/cable channel or vice versa. This diversity of input signal sources makes it difficult to design cost-effective receivers that support all desired modes of operation. For example, in a receiver with two or more television demodulators, the outputs from the demodulators may need to be multiplexed or rerouted to different video decoders based on the desired mode of operation. This selection of features has necessitated costly circuits such as discrete crossbar switches to support all desired functions. While modern integrated circuit manufacturing technologies have resulted in significant component cost reduction, further cost reduction is desirable while maintaining all desired operational modes.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

In one form, a multi-chip module for a multi-mode receiver includes an MCM substrate and first and second demodulator die. The MCM substrate has first and second satellite input ports, first and second terrestrial/cable input ports, and first and second transport stream ports. The first demodulator die has a satellite port coupled to the first satellite input port of the MCM substrate, a terrestrial/cable port coupled to the first terrestrial/cable input port of the MCM substrate, and first and second transport stream ports coupled to the first and second transport stream ports of the MCM substrate. The second demodulator die has a satellite port coupled to the second satellite input port of the MCM substrate, a terrestrial/cable port coupled to the second terrestrial/cable input port of the MCM substrate, and first and second transport stream ports coupled to the first and second transport stream ports of the MCM substrate. By connecting transport stream ports of the two demodulator die in common to corresponding transport stream ports of the MCM substrate, the MCM can be made more cheaply by eliminating the need for a discrete crossbar switch.

In another form, a demodulator for a multi-mode receiver includes a first input port, a second input port, a first transport stream port, a second transport stream port, a demodulator core, and a switching circuit. The demodulator core is responsive to an input from a selected one of the first input port and the second input port for providing a first transport stream signal to an output thereof. The switching circuit is responsive to a first mode for coupling the output of the demodulator core to a selected one of the first and second transport stream ports. In one configuration, the demodulator can be used by itself to form a low-cost receiver by connecting only one of its transport stream output ports to an integrated circuit package or MCM. In another configuration, the demodulator can be combined with one or more similar demodulators in a multi-chip module or other collection of circuits to form a high function receiver for applications such as high-end televisions and set-top boxes.

In yet another form, a method includes receiving a first input signal on a first input port of a first demodulator die, receiving a second input signal on a second input port of the first demodulator die, demodulating a selected one of the first input signal and the second input signal to provide a first demodulated output signal, switching the first demodulated output signal to a first transport stream port in response to a first mode of operation, and switching the first demodulated output signal to a second transport stream port in response to a second mode of operation. This method can be used, for example, to implement a television receiver which receives both satellite and terrestrial/cable signals to support multiple modes of operation.

Figure 1:
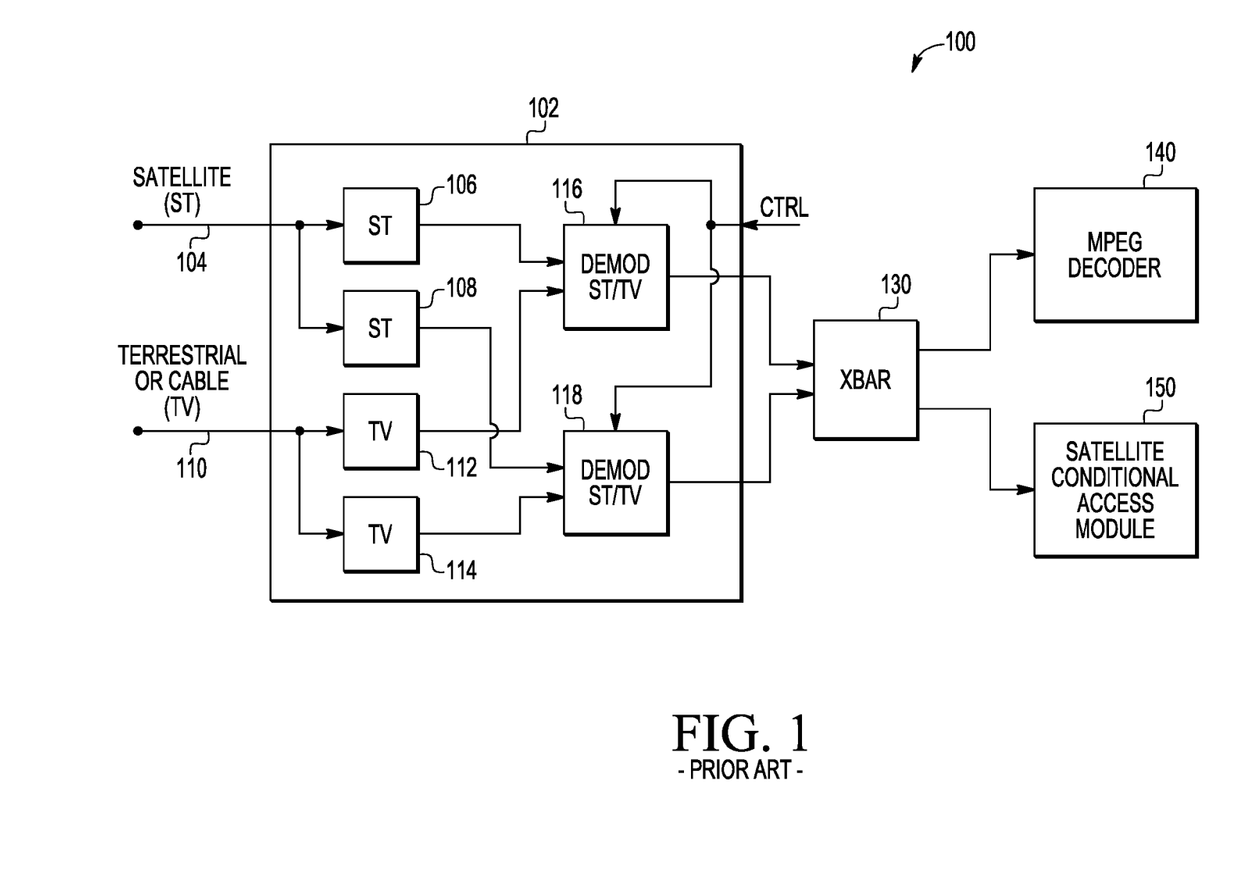
FIG. 1 illustrates in block diagram form a multi-mode receiver known in the prior art.

FIG. 1 illustrates in block diagram form a multi-mode receiver 100 known in the prior art. Multi-mode receiver 100 includes generally a tuner portion 102, a crossbar switch 130 labeled "XBAR", a decoder 140 capable of decoding a Motion Picture Experts Group (MPEG) signal stream labeled "MPEG DECODER", and a decoder 150 labeled "SATELLITE CONDITIONAL ACCESS MODULE".

Tuner portion 102 includes four tuners 106, 108, 112, and 114 and two demodulators 116 and 118. Tuner 106 is a satellite tuner labeled "ST" having an input adapted to be coupled to a first type of signal source such as a satellite radio dish antenna, and an output. Tuner 108 is a satellite tuner (ST) having an input adapted to be coupled to the first type of signal source, and an output. Tuner 112 is a television tuner labeled "TV" having an input adapted to be coupled to a second type of signal source such as a television antenna, cable, and the like, and an output. Tuner 114 is a television tuner (TV) having an input adapted to be coupled to the second type of signal source, and an output.

Demodulator 116 has a first input connected to the output of tuner 106, a second input connected to the output of tuner 112, a control input for receiving a control signal labeled "CTRL", and an output. Demodulator 118 has a first input connected to the output of tuner 108, a second input connected to the output of tuner 114, a control input for receiving signal CTRL, and an output.

Crossbar switch 130 has a first input connected to the output of demodulator 116, a second input coupled to the output of demodulator 118, and first and second outputs. Decoder 140 has an input connected to the first output of crossbar switch 130, and an output (not shown in FIG. 1). Decoder 150 has an input connected to the second output of crossbar switch 130, and an output (not shown in FIG. 1).

Note that various signals are depicted herein as single signal lines for simplicity but actually include multiple individual signal lines. For example, the satellite and terrestrial or cable inputs are usually differential signals, and the outputs of demodulators 116 and 118 are transport stream signals defined by the MPEG standard and include twelve digital signal lines. Moreover the CTRL signal is actually a set of control signals that are different for each demodulator.

In operation, multi-mode receiver 100 is useful in applications such as multi-tuner televisions or set-top boxes to provide a variety of user-defined functions. For example if a user wants to record a satellite program while watching a cable program, then a host (not shown in FIG. 1) would provide the CTRL signal in a state to enable demodulator 116 to select its first input and demodulator 118 to select its second input. The host would also configure crossbar switch 130 to switch the output of demodulator 116 to decoder 150 to decrypt the video signal stream and decode the MPEG data, while switching the output of demodulator 118 to decoder 140 to decode the terrestrial or cable-based MPEG data stream. By including four tuners and providing the output of one cable tuner and one terrestrial/cable tuner to each demodulator, multi-mode receiver 100 provides the user with significant flexibility of functions.

Moreover, the components in tuner portion 102 can take advantage of modern integrated circuit technology to provide a low cost and flexible implementation. For example, each demodulator can be formed using a separate integrated circuit die that can be combined with another similar or identical die for a multi-tuner implementation. Alternatively, the same demodulator die can be used as the sole demodulator for a low-cost implementation. Moreover, the two demodulator dies can be designed using low-voltage complementary metal-oxide-semiconductor (CMOS) manufacturing processes and can be combined in a multi-chip module for further cost reduction. While these techniques enable low-cost designs, further cost reduction is desirable while retaining the same functionality.

Figure 2:
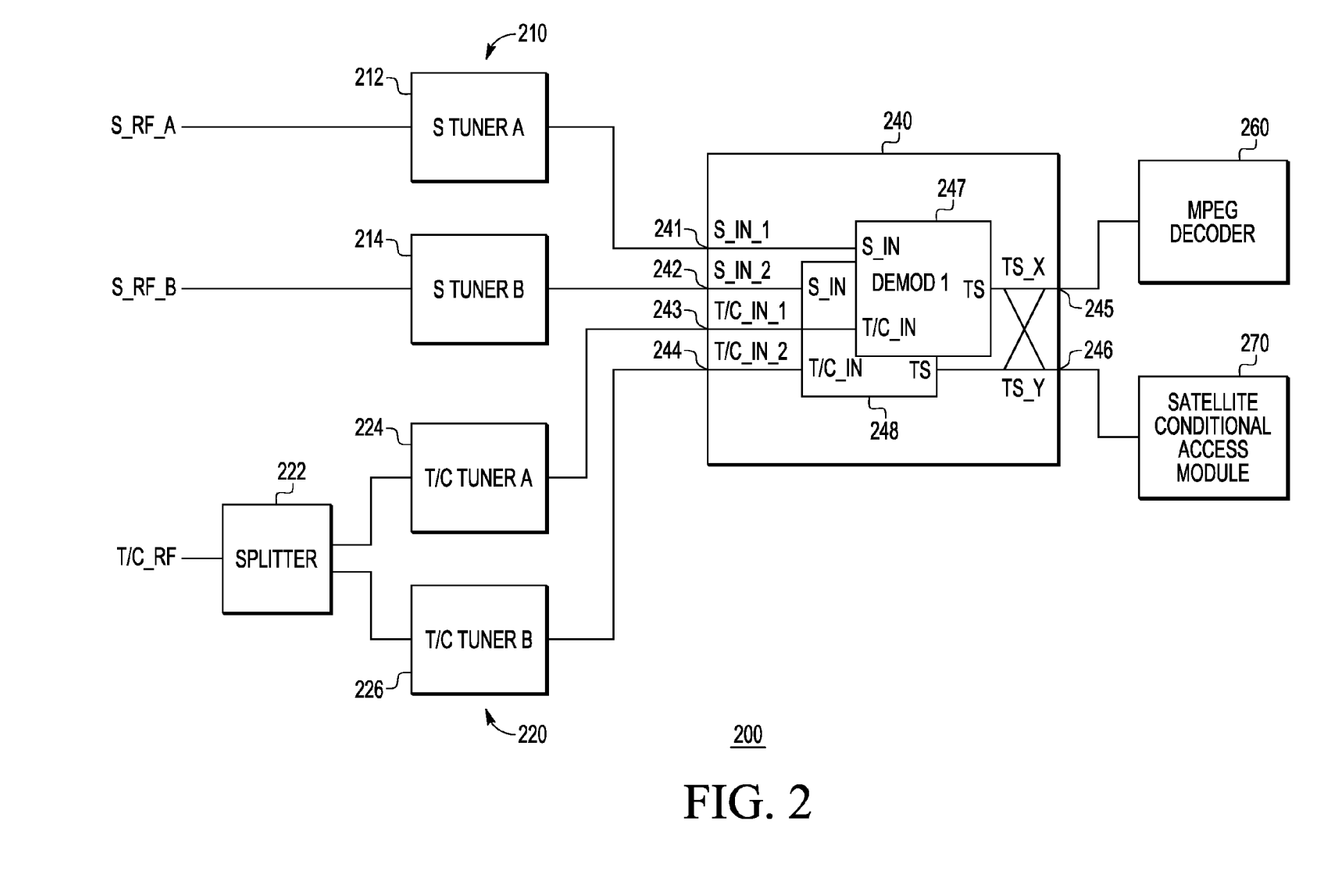
FIG. 2 illustrates in block diagram form a multi-mode receiver according to one embodiment.

FIG. 2 illustrates in block diagram form a multi-mode receiver 200 according to one embodiment. Multi-mode receiver 200 includes generally a satellite tuner section 210, a terrestrial/cable tuner section 220, a multi-chip module (MCM) 240, an MPEG decoder 260, and a satellite conditional access module 270.

Satellite tuner section 210 includes a satellite tuner 212 labeled "S TUNER A" and a satellite tuner 214 labeled "S TUNER B". Satellite tuner 212 has an input for receiving a radio frequency (RF) input signal from a satellite labeled "S_RF_A", and an output. Satellite tuner 214 has an input for receiving an RF input signal from a satellite labeled "S_RF_B", and an output.

Terrestrial/cable tuner section 220 includes a splitter 222, a terrestrial/cable tuner 224 labeled "T/C TUNER A", and a terrestrial/cable tuner 224 labeled "T/C TUNER B". Splitter 222 has an input adapted to be connected to, for example, a residential cable access point, and first and second outputs. Terrestrial/cable tuner 224 has an input connected to the first output of splitter 222, and an output. Terrestrial/cable tuner 226 has an input connected to the second output of splitter 222, and an output.

MCM 240 includes a first demodulator die 247 and a second demodulator die 248, and has a first satellite input port 241 connected to the output of satellite tuner 212 for receiving a signal labeled "S_IN_1", a second satellite input port 242 connected to the output of tuner 214 for receiving a signal labeled "S_IN_2", a first terrestrial/cable input port 243 connected to the output of terrestrial/cable tuner 224 for receiving a signal labeled "TC_IN_1", a second terrestrial/cable input port 244 connected to the output of tuner 226 for receiving a signal labeled "TC_IN_2", a fifth MCM terminal 245 for providing a transport stream signal labeled "TS_X" and a sixth terminal 246 for providing a transport stream signal labeled "TS_Y". MCM 240 includes a first demodulator die 247 and a second demodulator die 248. Demodulator die 247 has a satellite input terminal labeled "S_IN" connected to MCM terminal 241, a terrestrial/cable terminal labeled "T/C_IN" connected to first terrestrial/cable input port 243, a first transport stream output terminal connected to first transport stream port 245, and a second transport stream output terminal connected to second transport stream port 246. Demodulator die 248 has a satellite input terminal also labeled "S_IN" connected to second satellite input port 242, a terrestrial/cable terminal also labeled "T/C_IN" connected to MCM terminal 244, a first transport stream output terminal connected to first transport stream port 245, and a second transport stream output terminal connected to second transport stream port 246.

MPEG decoder 260 has an input terminal connected to first transport stream port 245, and an output (not shown in FIG. 2). Satellite conditional access module 270 has an input terminal connected to second transport stream port 246, and an output (not shown in FIG. 2).

Unlike multi-mode receiver 100 of FIG. 1, multi-mode receiver 200 eliminates the need for a discrete crossbar switch, which reduces overall cost by reducing printed circuit board space and chip count. As will be described in greater detail below, the multi-mode receiver 200 uses demodulator dies 247 and 248 and distributes the output signal switching function between the two. Thus corresponding outputs of each die can be connected to common MCM terminals while still allowing the host to configure multi-mode receiver 200 flexibly during operation. Moreover, each die can be used either in a low cost receiver with a single demodulator, or a high function receiver with two or more demodulators in a common MCM. Each demodulator die includes both a demodulator core and a switching circuit and supports additional functions to provide further flexibility. One of these functions is a failsafe mechanism to allow the demodulators to independently detect and prevent the harmful effects of a collision if both dies try to drive a single transport stream output. Another function is the ability to connect the dies in a way to perform channel bonding. These additional capabilities will be described further below.

Note that while FIG. 2 shows an MCM with two demodulator die, this approach can be extended to an arbitrary number of demodulator die for receiver applications with even higher functions. Also while FIG. 2 has been described with respect to the MPEG transport stream, any other data transport stream protocol may be used as well, such as the Generic Stream Encapsulated (GSE) protocol.

Figure 3:
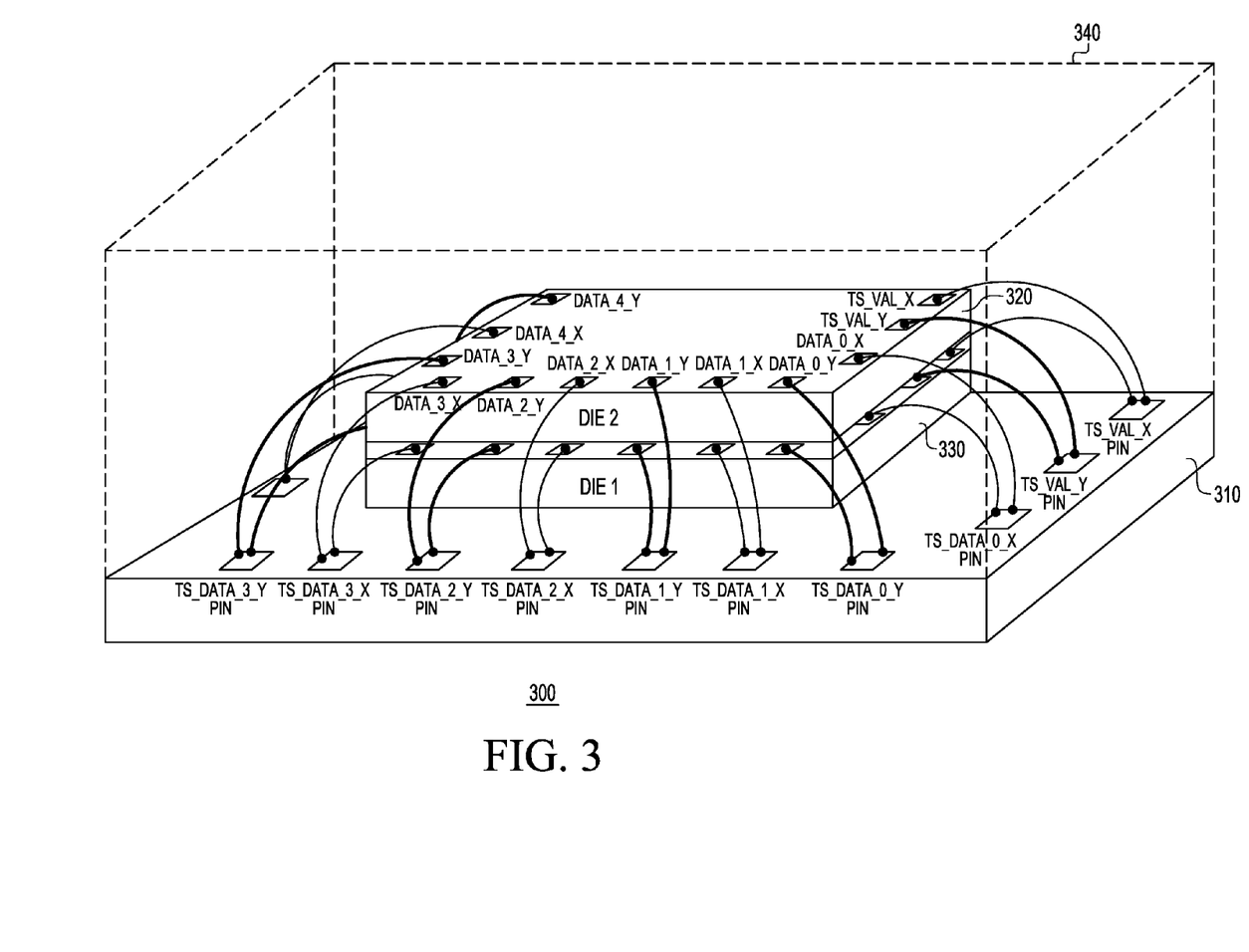
FIG. 3 illustrates a perspective view of a multi-chip module implementing the multi-mode receiver of FIG. 2.

FIG. 3 illustrates a perspective view of an MCM 300 implementing the multi-mode receiver of FIG. 2. MCM 300 includes an MCM substrate 310, a first demodulator die 320, a second demodulator die 330, and an encapsulant 340. MCM substrate 310 is a substrate providing a set of landing pads for wire bonding to corresponding chip signal pads, and a set of corresponding terminals such as solder balls in the case of ball grid array (BGA) packaging or terminals flush with the underside of MCM substrate 310.

As shown in FIG. 3, substrate 310 includes a set of landing pads on the top side of MCM substrate 310 corresponding transport streams X and Y including as a set of representative landing pads shown in FIG. 3. TABLE I shows the complete list of MPEG transport stream signals supported by MCM 300:

TABLE I

| MCM Pin Name | Transport Stream Port | Function |
| --- | --- | --- |
| TS_SYNC_X | X | Synchronization signal |
| TS_VAL_X | X | Valid signal |
| TS_CLK_X | X | Clock signal |
| TS_DATA<7:0>_X | X | Data |
| TS_ERR_X | X | Error signal |
| TS_SYNC_Y | Y | Synchronization signal |
| TS_VAL_Y | Y | Valid signal |
| TS_CLK_Y | Y | Clock signal |
| TS_DATA<7:0>_Y | Y | Data |
| TS_ERR_Y | Y | Error signal |

In an exemplary embodiment, MCM substrate 310 is a lead frame in which first demodulator die 320 and second demodulator die 330 overlie a paddle, and in which encapsulant 340 is a plastic. First demodulator die 320 is attached to the paddle of MCM substrate 310 using silver filed epoxy for mechanical adhesion to the paddle. Second demodulator die 330 is attached to first demodulator die 320 using a nonconductive adhesive film (not visible in FIG. 3) of sufficient height to allow the bond wires to extend through the film (wire-on-film) from bonding pads on first demodulator die 320 to corresponding landing pads on MCM substrate 310 without encroachment.

In other embodiments, MCM 300 can be implemented with other well known packaging technologies, such as ceramic, micro-BGA, plastic QFN and the like.

Figure 4:
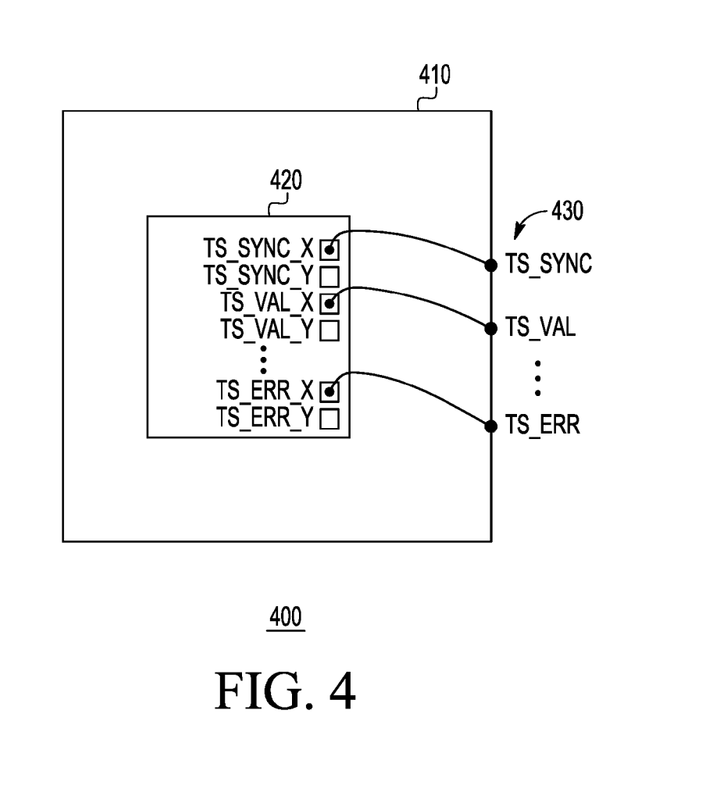
FIG. 4 illustrates in block diagram form a demodulator using a single demodulator die to form a low-cost receiver.

FIG. 4 illustrates in block diagram form a demodulator 400 using a single demodulator die 420 to form a low-cost receiver. Demodulator 400 has a first input port for connecting to a satellite receiver and a second input port for connecting to a terrestrial/cable receiver, neither of which is specifically shown in FIG. 4. Demodulator 400 provides only a single transport stream output to a transport stream port 430 and includes only a single demodulator die 420 mounted on an integrated circuit substrate 410. Demodulator die 420 intermixes bond pads of both the TS_X and TS_Y ports to preserve a regular placement of bond wires even when supporting only a single transport stream output. The bond pads of demodulator die 420 are wire-bonded to landing pads corresponding to the single transport stream output port.

Figure 5:
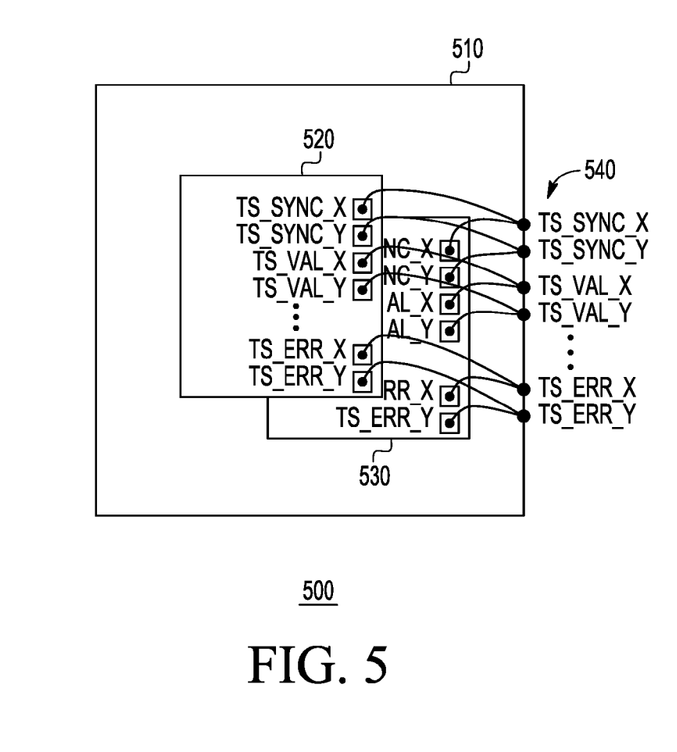
FIG. 5 illustrates in block diagram form a demodulator using multiple demodulator die to form a high-function receiver.

FIG. 5 illustrates in block diagram form a demodulator 500 using multiple demodulator die to form a high-function receiver. Demodulator 500 has a first input port for connecting to a satellite receiver and a second input port for connecting to a terrestrial/cable receiver, neither of which is specifically shown in FIG. 5. Demodulator 500 provides dual transport stream outputs to a corresponding output port 540 and includes a first demodulator die 520 and a second demodulator die 530 mounted on an integrated circuit substrate 510. First demodulator die 520 intermixes bond pads of both the TS_X and TS_Y ports to preserve a regular placement of bond wires even when supporting only a single transport stream output. The bond pads of first demodulator die 520 are wire-bonded to landing pads corresponding to the two transport stream output ports. Likewise, the bond pads of second demodulator die 530 are wire-bonded to landing pads corresponding to the two transport stream output ports.

Figure 6:
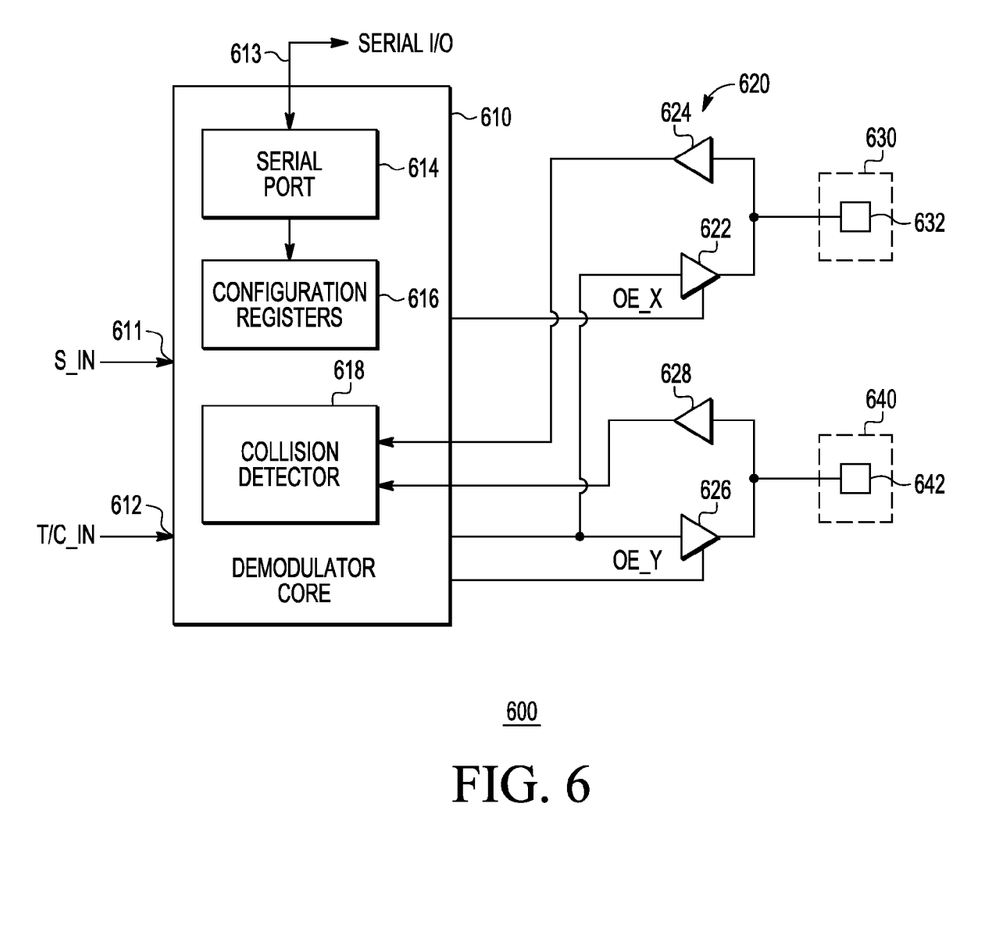
FIG. 6 illustrates in block diagram form a demodulator that can be used as one of the demodulators of any of FIGS. 2-5.

FIG. 6 illustrates in block diagram form a demodulator 600 that can be used as one of the demodulators of any of FIGS. 2-5. Demodulator 600 includes a demodulator core 610, a switching circuit 620, a first transport stream port 630, and a second transport stream port 640. Demodulator core 610 includes a first input port 611 for receiving a satellite input signal labeled "S_IN", a second input terminal 612 for receiving a terrestrial/cable input labeled "T/C_IN", a serial input/output terminal 613 for transmitting signals labeled "SERIAL I/O", a serial port 614, a set of configuration registers 616, and a collision detector 618. Serial port 614 controls the serial communication over the SERIAL I/O signals with an external host to receive and store configuration information in configuration registers 616. The configuration information includes the selection of an input mode which determines whether demodulator core 610 demodulates the S_IN signal or the T/C_IN signal, and the selection of transport stream port X, transport stream port Y, or both transport stream port X and transport stream port Y. According to this latter selected mode, demodulator core 610 activates a signal labeled "OE_X" to select the X port, "OE_Y" to select the Y port, or both OE_X and OE_Y to select both transport stream ports X and Y. Collision detector 618 has first and second inputs, and outputs (not specifically shown in FIG. 6) for providing a collision signal.

Switching circuit 620 includes a set of input and output buffers for each signal of the transport stream port as described above in TABLE I, of which a representative one transport stream port data is shown in FIG. 6. Thus switching circuit 620 includes for this one representative transport stream port buffers 622, 624, 626, and 628. Buffer 622 is an output buffer and has an input connected to the output of demodulator core 610, an output, and a control input for receiving signal labeled "OE_X". Buffer 624 is a readback buffer and has an input connected to the output of buffer 622, and an output connected to the first input of collision detector 618. Buffer 626 is an output buffer and has an input connected to the output of demodulator core 610, an output, and a control input for receiving a signal labeled "OE_Y". Buffer 628 is a readback buffer and has an input connected to the output of buffer 626, and an output connected to the second input of collision detector 618.

First transport stream port 630 includes, for example, twelve terminals each comprising a bonding pad, in which FIG. 6 illustrates a representative bonding pad 632 connected to the output of buffer 622 and to the input of buffer 624. Second transport stream port 640 includes, for example, twelve terminals each comprising a bonding pad, in which FIG. 6 illustrates a representative bonding pad 642 connected to the output of buffer 626 and to the input of buffer 628.

Demodulator 600 includes an additional collision detection function that allows demodulator 600 to detect a collision and to take appropriate actions. If operating properly, software running on the host should configure no more than one of the two or more demodulators to drive output signals on any respective transport stream port. Thus the host sends serial data on serial port 614 to enable the appropriate one or ones of buffers 622 and 626, while keeping the other one or ones in high impedance mode. However if the host hardware or software malfunctions or the data transmitted to serial port 614 to configure the output buffers malfunctions, then collision detector 618 and readback buffers 624 and 628 provide a failsafe mechanism to disable operation when a collision is detected. For example, suppose that the MCM includes two demodulator die, and both of the two are erroneously configured to drive transport stream port 1 at the same time. In this case, a collision detector 618 on one of the two die will eventually detect a mismatch between the logic state intended to be driven and the logic state actually present on the bus. For example if the first demodulator attempts to drive a logic low value while the second demodulator attempts to drive a high value, the value on the commonly connected transport stream port will assume an intermediate state which one collision detector 618 sees as a mismatch. The demodulator that sees the mismatch will immediately disable all output buffers on the corresponding demodulator die and signal an interrupt to the host. Thus the collision detection mechanism prevents integrated circuit damage by quickly disabling one of the demodulators and by signaling the host so the host can diagnose the cause of the collision.

Figure 7:
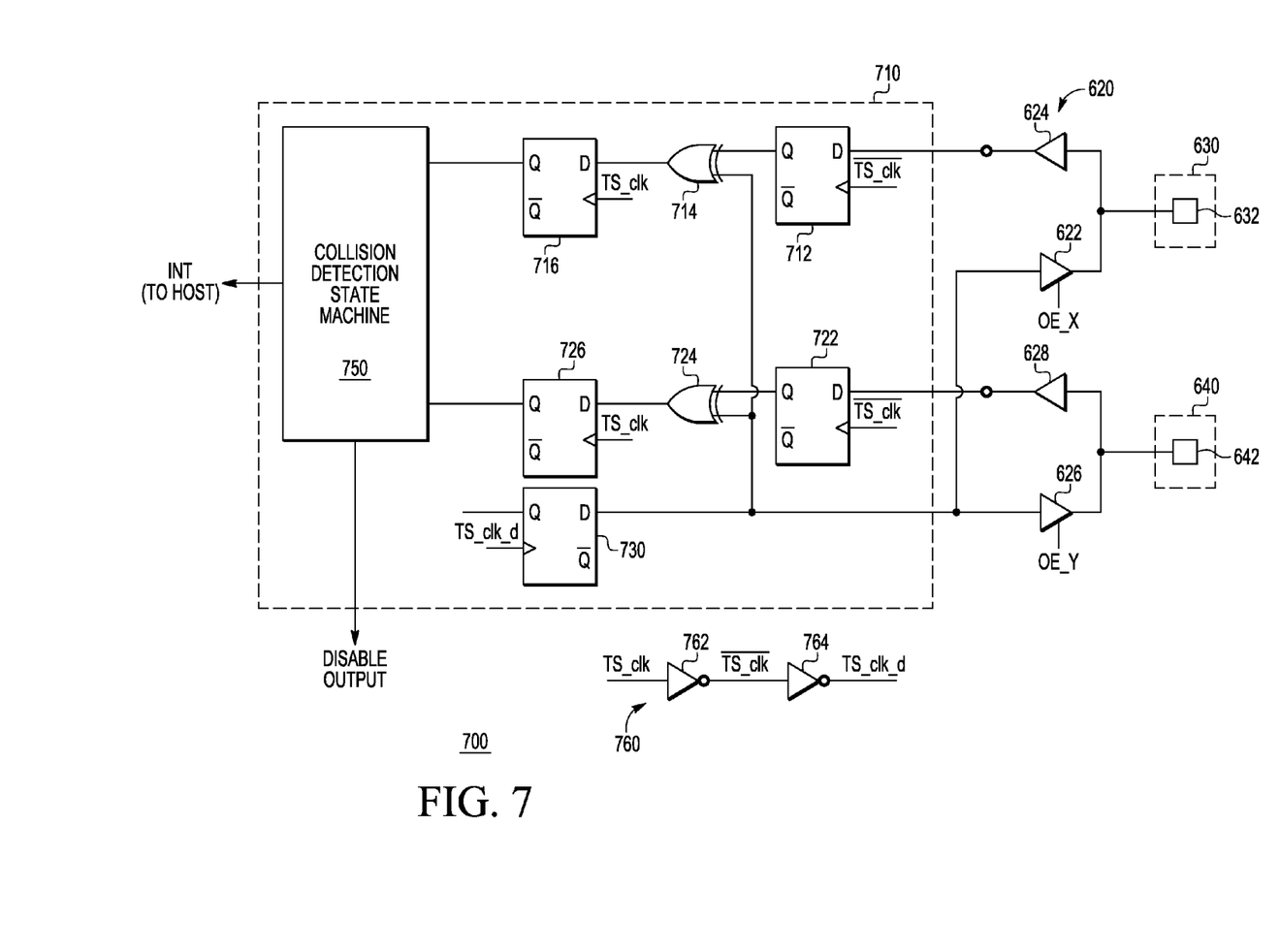
FIG. 7 illustrates in block diagram form a demodulator like the demodulator of FIG. 6 illustrating further details of the collision detector.

FIG. 7 illustrates in block diagram form a demodulator 700 like demodulator 600 of FIG. 6 illustrating further details of the collision detector. Demodulator 700 includes switching circuit 620, first transport stream port 630, and second transport stream port 640 as previously illustrated in FIG. 6, and a collision detector 710. Collision detector 710 includes a flip-flop 712, an exclusive OR gate 714, a flip-flop 716, a flip-flop 722, an exclusive OR gate 724, a flip-flop 726, a flip-flop 730, a collision detection state machine 750, and a clock generation circuit 760. Flip-flop 712 is a D-type flip-flop having a D input connected to the output of buffer 624, a clock input for receiving a signal labeled "TS_CLK", a Q output, and an unused $\overline{Q}$ output. Exclusive OR gate 714 has a first input connected to the Q output of flip-flop 712, a second input, and an output. Flip-flop 716 is a D-type having a D input connected to the output of exclusive OR gate 714, a clock input for receiving a signal labeled "TS_CLK", a Q output, and an unused $\overline{Q}$ output. Flip-flop 722 is a D-type flip-flop having a D input connected to the output of buffer 628, a clock input for receiving the $\overline{TS\_CLK}$ signal, a Q output, and an unused $\overline{Q}$ output. Exclusive OR gate 724 has a first input connected to the Q output of flip-flop 722, a second input, and an output. Flip-flop 726 is a D-type flip-flop having a D input connected to the output of exclusive OR gate 724, a clock input for receiving the TS_CLK signal, a Q output, and an unused $\overline{Q}$ output. Flip-flop 730 is a D-type flip-flop having a D input for receiving an output data signal, a clock input for receiving a signal labeled "TS_CLK_D", a Q output connected to the second inputs of exclusive OR gates 714 and 724 and to the inputs of buffers 622 and 626, and an unused $\overline{Q}$ output.

Collision detection state machine 750 has a first input connected to the Q output of flip-flop 716, a second input connected to the Q output of flip-flop 726, a first output for providing an interrupt signal labeled "INT", and a second output for providing a control signal labeled "DISABLE OUTPUT". Clock generation circuit 760 includes inverters 762 and 764. Inverter 762 has an input for receiving the TS_CLK signal, and an output for providing the $\overline{TS\_CLK}$ signal. Inverter 762 has an input connected to the output of inverter 762, and an output for providing the TS_CLK_D signal.

Flip-flops 712 and 722 capture the values on transport stream ports 630 and 640 through readback buffers 624 and 628, respectively coincident with the rising edge of the $\overline{TS\_CLK}$ signal. Meanwhile, flip-flop 730 functions to capture the output data coincident with the rising edge of the TS_CLK_D signal. Thus, exclusive OR gates 714 and 724 compare the outgoing data with the readback data at a point in time when they are both stable. The outputs of exclusive OR gates 714 and 724 are a logic high when the outgoing data is dissimilar to the readback data, which indicates a collision. The outputs of the exclusive OR gates 714 and 724 are then captured one-half clock cycle later in flip-flops 716 and 726, which are active on the rising edge of the TS_CLK signal.

In response to an activation of the Q output of either flip-flop 716 or flip-flop 726, collision detection state machine 750 detects a collision. It takes two actions in response. First, it activates the DISABLE OUTPUT signal. Control circuitry in demodulator 700 activates signals OE_X and OE_Y in partial dependence on the DISABLE OUTPUT signal such that in response to an activation of the DISABLE OUTPUT signal, the control circuitry keeps the OE_X and OE_Y signals inactive, which in turn prevents buffers 622 and 626 from driving transport stream ports 630 and 640, respectively. These signals remain inactive until demodulator 700 is reset by the host.

The second action is that collision detection state machine 750 activates the INT signal to the host. In response, the host interrupt vector may provide a mechanism to read the registers of the demodulator die through their serial I/O ports and determine which port of which particular demodulator die was erroneously set, and take any further corrective or reporting actions it deems appropriate.

As with FIG. 6 above, the signals in demodulator 700 are merely representative of one data signal and demodulator 700 will include similar circuitry for each transport stream data signal such that collision detection state machine 750 is able to detect a collision on any data signal. In this way, it will detect the collision early, even when some or maybe most of the data is coincident between the two or more demodulators.

Providing readback buffers such as buffers 624 and 628 for each transport stream output pin allows an additional capability which will now be described.

Figure 8:
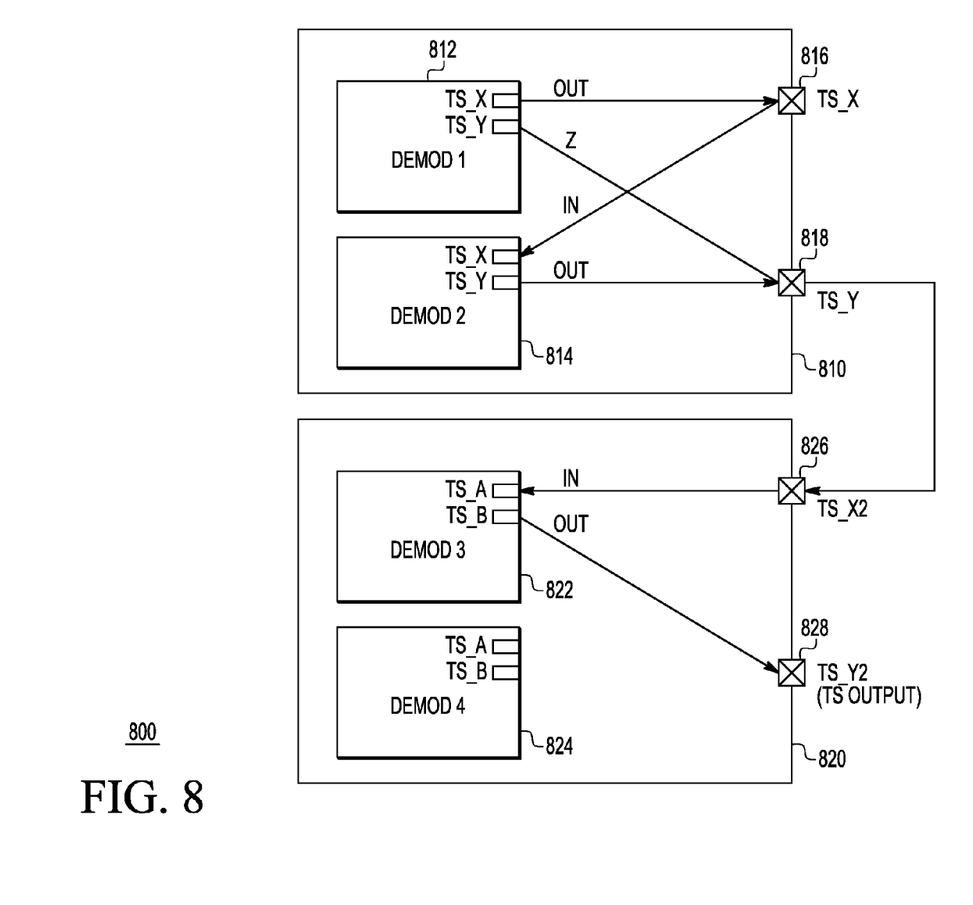
FIG. 8 illustrates in block diagram form a receiver using the demodulator die of FIGS. 6 and 7 to support a channel bonding mode.

FIG. 8 illustrates in block diagram form a receiver 800 using the demodulator die of FIGS. 6 and 7 to support a channel bonding mode. Receiver 800 includes a first MCM 810 and a second MCM 820. First MCM 810 includes a demodulator die 812 and a demodulator die 814 whose bond pads are wire bonded to the MCM substrate as shown in FIG. 5 above. First MCM 810 has a TS_X output port illustrated by a representative MCM terminal 816 and a TS_Y port illustrated by a representative MCM terminal 818. Each of demodulator die 812 and demodulator die 814 includes both a TS_X port and a TS_Y port wire bonded to the TS_X and TS_Y ports, respectively, of first MCM 810. As shown in FIG. 8, the host has configured the TS_X port of demodulator die 812 to be active, while the TS_Y port of demodulator die 812 is inactive. The host also configures the TS_X port of demodulator die 814 to be inactive, while the TS_Y port of demodulator die 812 is active. However, the host configures demodulator die 814 to use the TS_X port as an input port using the available readback buffers. Thus, the availability of readback buffers allows first MCM 810 to implement a function known as channel bonding in which the TS_X output of demodulator die 812 is combined with the output of the demodulator core of demodulator die 814 to form a bonded channel signal which is then provided to the TS_Y port of MCM 810.

MCM 820 provides further channel bonding. Second MCM 820 includes a demodulator die 822 and a demodulator die 824 whose bond pads are wire bonded to the MCM substrate as shown in FIG. 5 above. Second MCM 820 has a TS_X2 port illustrated by a representative MCM terminal 826 and a TS_Y2 port illustrated by a representative MCM terminal 828. Each of demodulator die 822 and demodulator die 824 includes both a TS_X port and a TS_Y port wire bonded to the TS_X2 and TS_Y2 ports, respectively, of second MCM 820. As shown in FIG. 8, the host has configured the TS_X port of demodulator die 822 to be inactive, and the TS_Y port of demodulator die 822 to be active. In the example of FIG. 8 in which three channels are bonded, the host also configures both the TS_X port and the TS_Y port of demodulator die 824 to be inactive. The host configures demodulator die 824 to use the TS_X port as an input port using the available readback buffers, and second MCM 820 extends the channel bonding to three channels.

The above-disclosed subject matter is to be considered illustrative, and not restrictive, and the appended claims are intended to cover all such modifications, enhancements, and other embodiments that fall within the true scope of the claims. For example, the MCM was described herein in the context of television receivers that receive both a satellite input as a first type of input and a terrestrial/cable input as a second type of input. In other embodiments, the receiver can support other types of signal sources. Moreover while the example above included two demodulator die, the MCM can be expanded to three or more demodulator die to support additional functions. Moreover other types of transport streams can be supported besides the MPEG and GSE streams described above. Also a variety of package types such as BGA, micro-BGA, quad flat-pack (QFP), quad flat no-leads (QFN) and the like may be used for the MCM.

Thus, to the maximum extent allowed by law, the scope of the present invention is to be determined by the broadest permissible interpretation of the following claims and their equivalents, and shall not be restricted or limited by the foregoing detailed description.

What is claimed is:

1. A multi-chip module (MCM) for a multi-mode receiver comprising:
   an MCM substrate having first and second satellite input ports, first and second terrestrial/cable input ports, and first and second transport stream ports;
   a first demodulator die having a satellite port coupled to said first satellite input port of said MCM substrate, a terrestrial/cable port coupled to said first terrestrial/cable input port of said MCM substrate, and first and second transport stream ports coupled to said first and second transport stream ports of said MCM substrate; and
   a second demodulator die having a satellite port coupled to said second satellite input port of said MCM substrate, a terrestrial/cable port coupled to said second terrestrial/cable input port of said MCM substrate, and first and second transport stream ports coupled to said first and second transport stream ports of said MCM substrate.

2. The MCM of claim 1 wherein each of said first demodulator die and said second demodulator die comprises:
   a demodulator core responsive to an input from a selected one of said satellite port and said terrestrial/cable port for providing a transport stream signal; and
   a switching circuit for coupling said transport stream signal to a selected one of said first and second transport stream ports.

3. The MCM of claim 2 wherein said demodulator core comprises:
   a configuration register operative to configure the switching circuit to couple said transport stream signal to said selected one of said first and second transport stream ports.

4. The MCM of claim 3 wherein said demodulator core comprises:
   a serial port coupled to said configuration register for receiving said at least one configuration bit from a serial input/output port and storing said at least one configuration bit in said configuration register.

5. The MCM of claim 1 wherein said MCM substrate comprises a leadframe and a plastic encapsulant covering said first demodulator die, said second demodulator die, and said MCM substrate.

6. The MCM of claim 1 wherein each of said first and second transport stream ports comprise a plurality of terminals conducting signals corresponding to signals of a Motion Picture Experts Group (MPEG) transport stream.

7. The MCM of claim 1 wherein:
   said second demodulator die includes a demodulator core that provides a transport stream signal in response to an input signal received at one of said satellite port and said terrestrial/cable port
   in response to a channel bonding mode, said second demodulator die receives readback data from said first transport stream port of said MCM substrate, combines said readback data with said transport stream signal to form a bonded channel signal, and provides said bonded channel signal to said second transport stream port of said MCM substrate.

8. The MCM of claim 1 wherein:
   said second demodulator die includes a demodulator core that provides a transport stream signal in response to an input signal received at one of said satellite port and said terrestrial/cable port
   in a first mode, said second demodulator die provides said transport stream signal to said first transport stream port of said MCM substrate; said second demodulator die comprises a first readback buffer coupled to said first transport stream port thereof; and
   said second demodulator die further comprises a collision detector for comparing readback data received from said first readback buffer with outgoing data corresponding to said transport stream signal, and detecting a collision in response to a mismatch between said readback data and said transport stream signal.

9. The MCM of claim 8 wherein:
   in a second mode, said second demodulator die combines readback data received from said first readback buffer with said transport stream signal to form a bonded channel signal, and provides said bonded channel signal to said second transport stream port of said MCM substrate.

10. A multi-chip module (MCM) for a multi-mode receiver comprising:
an MCM substrate having first and second satellite input ports, first and second terrestrial/cable input ports, and first and second transport stream ports;
a first demodulator die; and
a second demodulator die,
wherein each of said first and second demodulator die include:
a first input port coupled to a respective one of said first and second satellite input ports of said MCM substrate;
a second input port coupled to a respective one of said first and second terrestrial/cable input ports of said MCM substrate;
a first transport stream port coupled to said first transport stream port of said MCM substrate;
a second transport stream port coupled to said second transport stream port of said MCM substrate;
a demodulator core responsive to an input from a selected one of said first input port and said second input port for providing a first transport stream signal to an output thereof; and
a switching circuit for coupling said output of said demodulator core to a selected one of said first and second transport stream ports while keeping another one of said first and second transport stream ports in a high impedance state.

11. The MCM of claim 10 wherein said demodulator core comprises:
a configuration register operative to configure the switching circuit to couple said transport stream signal to said selected one of said first and second transport stream ports.

12. The MCM of claim 11 wherein said demodulator core comprises:
a serial port coupled to said configuration register for receiving said at least one configuration bit from a serial input/output port and storing said at least one configuration bit in said configuration register.

13. The MCM of claim 10 wherein said MCM substrate comprises a leadframe and a plastic encapsulant covering said first demodulator die, said second demodulator die, and said MCM substrate.

14. The MCM of claim 10 wherein each of said first and second transport stream ports comprise a plurality of terminals conducting signals corresponding to signals of a Motion Picture Experts Group (MPEG) transport stream.

15. The MCM of claim 10 wherein:
said demodulator core of said second demodulator die provides a transport stream signal in response to an input signal received at one of said satellite port and said terrestrial/cable port
in response to a channel bonding mode, said second demodulator die receives readback data from said first transport stream port of said MCM substrate, combines said readback data with said transport stream signal to form a bonded channel signal, and provides said bonded channel signal to said second transport stream port of said MCM substrate.

16. The MCM of claim 10 wherein:
said demodulator core of said second demodulator die provides a transport stream signal in response to an input signal received at one of said satellite port and said terrestrial/cable port
in a first mode, said second demodulator die provides said transport stream signal to said first transport stream port of said MCM substrate; said second demodulator die comprises a first readback buffer coupled to said first transport stream port thereof; and
said second demodulator die further comprises a collision detector for comparing readback data received from said first readback buffer with outgoing data corresponding to said transport stream signal, and detecting a collision in response to a mismatch between said readback data and said transport stream signal.

17. The MCM of claim 16 wherein:
in a second mode, said second demodulator die combines readback data received from said first readback buffer with said transport stream signal to form a bonded channel signal, and provides said bonded channel signal to said second transport stream port of said MCM substrate.

18. A method for making a multi-chip module (MCM) for use in a multi-mode receiver comprising:
providing an MCM substrate having first and second satellite input ports, first and second terrestrial/cable input ports, and first and second transport stream ports;
attaching a first demodulator die to a top side of said MCM substrate, said first demodulator die having a satellite port coupled to said first satellite input port of said MCM substrate, a terrestrial/cable port coupled to said first terrestrial/cable input port of said MCM substrate, and first and second transport stream ports coupled to said first and second transport stream ports of said MCM substrate; and
attaching a second demodulator die to said first demodulator die, said second demodulator die having a satellite port coupled to said second satellite input port of said MCM substrate, a terrestrial/cable port coupled to said second terrestrial/cable input port of said MCM substrate, and first and second transport stream ports coupled to said first and second transport stream ports of said MCM substrate.

19. The method of claim 18 wherein:
said attaching said first demodulator die to said top side of said MCM substrate comprises attaching using bond wires; and
said attaching said second demodulator die to said first demodulator die comprises attaching using a non-conductive adhesive film to allow said bond wires to extend through said non-conductive adhesive film.

20. The method of claim 18 further comprising:
forming an encapsulant over said MCM substrate, said first demodulator die, and said second demodulator die.

* * * * *